(12) United States Patent
Adde et al.

(10) Patent No.: US 7,219,291 B2
(45) Date of Patent: May 15, 2007

(54) HIGH-SPEED MODULE, DEVICE AND METHOD FOR DECODING A CONCATENATED CODE

(75) Inventors: Patrick Adde, Brest (FR); Ramesh Pyndiah, Plouzane (FR)

(73) Assignees: France Telecom, Paris (FR); Groupe des Ecoles des Telecommunications - Enst Bretagne, Paris Cedex (FR)

( * ) Notice: Subject to any disclaimer, the term of this patent is extended or adjusted under 35 U.S.C. 154(b) by 276 days.

(21) Appl. No.: 10/416,484

(22) PCT Filed: Nov. 9, 2001

(86) PCT No.: PCT/FR01/03509

§ 371 (c)(1),
(2), (4) Date: Sep. 15, 2003

(87) PCT Pub. No.: WO02/39587

PCT Pub. Date: May 16, 2002

(65) Prior Publication Data

US 2004/0054954 A1 Mar. 18, 2004

(30) Foreign Application Priority Data

Nov. 10, 2000 (FR) .................................. 00 14521

(51) Int. Cl.
*H03M 13/29* (2006.01)
(52) U.S. Cl. ...................................... 714/755; 714/780
(58) Field of Classification Search ................ 714/755, 714/780
See application file for complete search history.

(56) References Cited

U.S. PATENT DOCUMENTS

| | | | | |
|---|---|---|---|---|
| 4,336,612 A | * | 6/1982 | Inoue et al. | 714/755 |
| 4,453,251 A | * | 6/1984 | Osman | 714/804 |
| 4,547,882 A | * | 10/1985 | Tanner | 714/755 |
| 5,559,506 A | * | 9/1996 | Leitch | 340/7.43 |
| 6,065,147 A | | 5/2000 | Pyndiah et al. | 714/755 |
| 6,182,261 B1 | * | 1/2001 | Haller et al. | 714/758 |
| 6,252,917 B1 | * | 6/2001 | Freeman | 375/340 |

(Continued)

FOREIGN PATENT DOCUMENTS

EP 1 024 601 8/2000

(Continued)

OTHER PUBLICATIONS

Lucas, R., et al., "On Iterative Soft-Decision Decoding of Linear Binary Block Codes and Product Codes", IEEE Journal on Selected Areas in Communications, vol. 16, No. 2, Feb. 1998, pp. 276-296.*

(Continued)

Primary Examiner—Stephen M. Baker
(74) Attorney, Agent, or Firm—Westman, Champlin & Kelly

(57) ABSTRACT

The invention concerns a module for decoding a concatenated code, corresponding at least to two elementary codes $C_1$ and $C_2$, using storage means (81, 83, 90, 111, 113) wherein are stored samples of data to be decoded, comprising at least two elementary decoders ($82_1$, $82_2$, ... $82_m$) of at least one of the elementary codes, the elementary decoders associated with one of the elementary codes simultaneously processing, in parallel separate code words contained in the storage means.

26 Claims, 8 Drawing Sheets

U.S. PATENT DOCUMENTS

| | | | |
|---|---|---|---|
| 6,292,918 B1 * | 9/2001 | Sindhushayana et al. ... | 714/755 |
| 6,304,995 B1 * | 10/2001 | Smith et al. .................. | 714/786 |
| 6,434,203 B1 * | 8/2002 | Halter .......................... | 375/341 |
| 6,477,678 B1 * | 11/2002 | Fang et al. ................... | 714/755 |
| 6,526,538 B1 * | 2/2003 | Hewitt ......................... | 714/780 |
| 6,658,605 B1 * | 12/2003 | Yoshida et al. .............. | 714/702 |
| 6,678,843 B2 * | 1/2004 | Giulietti et al. .............. | 714/701 |
| 6,715,120 B1 * | 3/2004 | Hladik et al. ................ | 714/755 |
| 6,738,942 B1 * | 5/2004 | Sridharan et al. ............ | 714/755 |
| 6,754,290 B1 * | 6/2004 | Halter .......................... | 375/340 |
| 6,775,800 B2 * | 8/2004 | Edmonston et al. ......... | 714/755 |
| 6,859,906 B2 * | 2/2005 | Hammons et al. ........... | 714/786 |

FOREIGN PATENT DOCUMENTS

EP    1 030 457    8/2000

OTHER PUBLICATIONS

"A Four-Level Storage 4-Gb DRAM", Takashi Okuda et al., IEEE Journal of Solid-State Circuits, vol. 3, No. 11, Nov. 1997, pp. 1743-1747.

* cited by examiner

US 7,219,291 B2

HIGH-SPEED MODULE, DEVICE AND METHOD FOR DECODING A CONCATENATED CODE

CROSS-REFERENCE TO RELATED APPLICATION

This Application is a Section 371 National Stage Application of International Application No. PCT/FR01/03509 filed Nov. 9, 2001 and published as WO 02/39587 on May 16, 2002, not in English.

FIELD OF THE INVENTION

The field of the invention is that of the encoding of digital data belonging to one or more sequences of source data to be transmitted, or broadcast, especially in the presence of noises of various sources, and of the decoding of the encoded data thus transmitted.

More specifically, the invention relates to an improvement in the technique of the decoding of codes known especially as "turbo-codes" (registered trademark), and more particularly the operation for the iterative decoding of concatenated codes.

BACKGROUND OF THE INVENTION

The transmission of information (data, images, speech, etc) increasingly relies on digital transmission techniques. A great deal of effort has been made in source encoding to reduce the digital bit rate and, at the same time, to preserve high quality. These techniques naturally require improved protection of the bits against transmission-related disturbance. The use of powerful error-correction codes in these transmission systems has proved to be indispensable. It is especially for this purpose that the technique of "turbo-codes" has been proposed.

The general principle of "turbo-codes" is presented especially in the French patent No FR-91 05280, entitled "Procédé de codage correcteur d'erreurs à au moins deux codages convolutifs systématiques parallèles" ("Method of error correction encoding with at least two parallel systematic convolutive encoding operations", and in C. Berrou, A. Glavieux and P. Thitimajshima "Near Shannon limit error-correcting coding and decoding: Turbo-codes" in IEEE International Conference on Communication, ICC'93, vol2/3, pages 1064 to 1071, May 1993. A prior art technique is recalled in C. Berrou and A. Glavieux "Near Optimum Error Correcting Coding and Decoding: Turbo-Codes" (IEEE Transactions on Communications, Vol. 44, No. 10, pages 1261–1271, October 1996).

This technique proposes the implementation of "parallel concatenation" encoding, which relies on the use of at least two elementary decoders. This makes available two redundancy symbols, coming from two distinct encoders. Between the two elementary encoders, permutation means are implemented so that each of these elementary encoders is supplied with source digital data which is the same data but taken in a different order each time.

A complement to this type of technique is used to obtain codes known as "block turbo-codes" or BTCs. This complementary technique is designed for block encoding (concatenated codes). This improved technique is described in R. Pyndiah, A. Glavieux, A. Picart and S. Jacq in "Near optimum decoding of product code" (in IEEE Transactions on Communications, volume 46, No 8 pages 1003 to 1010 August 1998), in the patent FR-93 13858, "Procédé pour transmettre des bits d'information en appliquant des codes en blocs concaténés" (Method for the Transmission of Information Bits by the Application of Concatenated Block Codes) and in O. Aitsab and R. Pyndiah "Performance of Reed Solomon Block Turbo-Code" (IEEE Globecom'96 Conference, Vol. 1/3, pages 121–125, London, November 1996).

This technique relies especially on the use of product codes introduced by P. Elias and described in his article "Error-Free Coding" in "IRE Transaction on Information Theory" (Vol. IT4, pages 29–27) September 1954. The product codes are based on the serial concatenation of block codes. The product codes have long been decoded according to hard-input and hard-output algorithms in which an elementary block code decoder accepts bits at input and gives them at output.

To decode block "turbo-codes", it is envisaged to use soft-input and soft-output decoding means in which an elementary block code decoder accepts bits, weighted as a function of their likelihood, at input and gives these bits at output.

Block "turbo-codes" are particularly attractive when data encoding is applied to small-sized blocks (for example blocks smaller than 100 bits) or when the efficiency of the code (that is, the number of useful data bits divided by the number of encoded data bits, for example, 0.95) is high and the error rate desired is low. Indeed, the performance level of the code, generally measured in terms of residual error rate as a function of a given signal-to-noise ratio, varies as a function of the minimum Hamming distance of the code which is very high in the case of block "turbo-codes" (9, 16, 24, 36 or more).

It is recalled first of all that a serial concatenated code can generally be represented in the form of a binary matrix [C] with a dimension 2 as illustrated in FIG. 1. This matrix [C] contains $n_1$ rows and $n_2$ columns and:

the binary information samples are represented by a sub-matrix 10, [M], with $k_1$ rows and $k_2$ columns;

each of the $k_1$ rows of the matrix [M] is encoded by an elementary code $C_2(n_2, k_2, \delta_2)$ (the redundancy is represented by a row redundancy sub-matrix 11);

each of the $k_2$ columns of the matrix [M] and of the row redundancy is encoded by an elementary code $C_1$ ($n_1$, $k_1$, $\delta_1$) (the redundancy corresponding to the binary information samples is represented by a column redundancy sub-matrix 12; the redundancy corresponding to the row redundancy of the sub-matrix 11 is represented by a redundancy of redundancy sub-matrix 13).

If the code $C_1$ is linear, the ($n_1$–$k_1$) rows built by $C_1$ are words of the code $C_2$ and may therefore be decoded as the $k_1$ first rows. A series concatenated code is characterized by $n_1$ code words of $C_2$ along the rows and by $n_2$ code words of $C_1$ along the columns. The codes $C_1$ and $C_2$ may be obtained from convolutive elementary codes used as block codes or linear block codes.

It is recalled that a parallel concatenated code can generally be represented in the form of a binary matrix [C] with a dimension 2 as illustrated in FIG. 1. This matrix [C] contains $n_1$ rows and $n_2$ columns and:

the binary information samples are represented by a sub-matrix 10, [M], with $k_1$ rows and $k_2$ columns;

each of the $k_1$ rows of the matrix [M] is encoded by an elementary code $C_2(n_2, k_2, \delta_2)$ (the redundancy is represented by a row redundancy sub-matrix 11);

each of the $k_2$ columns of the matrix [M] is encoded by an elementary code $C_1$ ($n_1$, $k_1$, $\delta_1$) (the redundancy corresponding to the binary information samples is represented by a column redundancy sub-matrix 12; there is no redundancy of redundancy in the case of parallel concatenated codes).

The different techniques of "turbo-decoding" are increasingly valuable for digital communications systems which require ever greater reliability. Furthermore, the transmission rates are increasingly high. The use of transmission channels on optical fibers is making it possible, in particular, to attain bit rates in the gigabit and even the terabit range.

The "turbo-decoding" of a code corresponding to the matrix C of FIG. 1 consists in carrying out a weighted-input and weighted-output decoding on all the rows and then all the columns of the matrix C, according to the iterative process illustrated in FIG. 2.

After reception 21 of the data to be processed, a predetermined number (Nb_Iter_Max) of the following operations is performed:

the decoding 22 of the columns (one half-iteration);
the reconstruction 23 of the matrix;
the decoding 24 of the rows (one half-iteration);
the reconstruction 25 of the matrix.

These operations are therefore repeated so long as the number i of iterations, incremented (26) at each iteration, is smaller than Nb_Iter_Max (27), the number i having been initialized beforehand at zero (28).

The decoded data, referenced $D_k$, are then processed (29).

In general, the information exchanged from one half-iteration 22, 25 to another are defined by FIG. 3.

$R_k$ corresponds to the information received from the channel, $R'_k$ corresponds to the information coming from the prior half-iteration and $R'^+_k$ corresponds to the information sent at the next half-iteration. The output of each half-iteration is therefore equal to the sum 36 of $R_k$ and of the extrinsic information, $W_k$, then multiplied (31) by a feedback or convergence coefficient alpha. This extrinsic information corresponds to the contribution of the decoder 32. It is obtained by taking the difference 33 between the weighted output $F_k$ of the decoder and the weighted input of this same decoder.

Time delays 34 and 35 are planned to compensate for the latency of the decoder 32.

Hereinafter, the weighted-input and weighted-output decoder will be considered to be a block having $R_k$ and $R'_k$ (sampled on q bits) as inputs, delivering $R'^+_k$ et $R^+_k$ (sampled on q bits) at the output with a certain latency L (the delay necessary to implement the decoding algorithm). It is called a Processing Unit (PU) 30.

The decoder 32 furthermore gives a binary decision $D_k$ used during the last half-iteration of a <<turbo-decoding>> operation, which corresponds to a decoded data element sent out during the operation 29 illustrated in FIG. 2.

If we consider another sub-division of the block diagram of FIG. 3, $R'_k$ may be replaced by the extrinsic information $W_k$ which becomes the input-output of the processing unit 40. $R'_k$ which is still used as an input of the decoder 32 is then an internal variable. This variant is illustrated by FIG. 4.

In the prior art, there are two different types of known types of decoder architecture for block "turbo-codes" based on:

a modular structure; or
a Von Neumann structure

In the modular structure, modules or elementary decoders are cascaded, each of these modules being responsible for a half-iteration. This processing is well suited to decoding weighted-input and weighted-output algorithms inasmuch as many functions in these algorithms are classically carried out in sequence and are then simple to implant.

A major drawback of this prior art technique is that it introduces high latency into data processing, the latency being the number of samples that comes out of the decoder before a piece of data present at input is located, in its turn, at output. This latency increases with the number of modules. Furthermore, space requirement of the circuit is itself also relatively great and increases with the number of modules. The latency and space requirements parameters of the circuit constitute an essential defect when the number of iterations and/or the length of the code increase.

In the Von Neumann structure, the circuit carries out several iterations by using a single storage unit and a single processing unit for all the iterations. An elementary decoding module is looped back on itself. With this architecture, the number of memories necessary is reduced. The gain in storage circuit surface area is considerable since the storage surface area is independent of the number of iterations. Nevertheless, a major drawback of this structure is that it leads to a reduction in the data throughput rate.

Thus, as already mentioned, a functional analysis of the <<turbo-decoding>> algorithm was used to identify two possible architectures for a product code <<turbo-decoder>> circuit (one architecture being modular and the other one being likened to a machine known as a Von Neumann machine). These two structures are now described with some greater precision.

a) Modular Structure

From the operating scheme of the algorithm, a modular structure may be imagined for the <<turbo-decoder>> in which each sub-circuit carries out a decoding half-iteration (i.e. a decoding of the rows and columns of a data matrix [R] and [W] or [R']). It is necessary to memorize [R] and [W] (or [R'], depending on the block diagram of the chosen processing unit 30 or 40).

The complete circuit is then constituted by cascaded, identical modules as shown in FIG. 5. For four iterations for example, the circuit uses eight modules, or elementary decoders.

With the modular architecture, the data are processed sequentially (sample after sample). This processing is well suited to the weighted-input and weighted-output decoding algorithms inasmuch as many functions in these algorithms are classically performed in sequence and are then simple to implant.

Each module introduces a latency of $(n_1 n_2 + L)$ samples. The latency is the number of samples coming out of the decoder before a piece of data present at input is located, in its turn, at output. In this expression, the $n_1 n_2$ first samples correspond to the filling of a data matrix and the L next samples correspond to the decoding proper of a row (or column) of this matrix.

b) Von Neumann Structure

The second architecture can be likened to a Von Neumann sequential machine. It uses one and the same processing unit to carry out several iterations. In comparison with the previous solution, this one is aimed chiefly at reducing the space requirement of the <<turbo-decoder>>. It furthermore has the advantage of limiting the overall latency introduced by the circuit, independently of the number of iterations performed, to $2.n_1 n_2$ samples at the maximum ($n_1 n_2$ to fill a matrix and $n_1 n_2$ additional samples for the decoding).

Each sample is processed sequentially and must be decoded in a time that does not exceed the inverse of the product of the data throughput rate multiplied by the number of half-iterations to be performed. Thus, for four iterations, the data throughput rate can only be at least eight times lower than the data processing rate. This means that, between the modular architecture and the Von Neumann architecture, the maximum data throughput rate is divided by a factor at least equal to the number of half-iterations used. The latency is lower for the Von Neumann structure (2 $n_1 n_2$ samples at the maximum as against $(n_1 n_2+L)$.it in the other, it being the number of half-iterations) but the data throughput rate is lower for a same data processing speed.

The maximum number of iterations that can be integrated into the circuit is limited by the bit rate to be attained and by the maximum frequency of operation authorized by the technology used.

The memory aspects shall now be described with reference to these two structures. In any case, the space requirement of the circuit essentially arises out of the size and number of the memories used. Independently of the general architecture chosen, it is indeed indispensable to memorize the matrices [R] and [W] (or [R']) for the entire duration of the half-iteration in progress (a half-iteration corresponds to a decoding of the rows or columns of a data matrix). The processing of the data in rows and then in columns makes it necessary to provide for a first memory to receive the data and a second memory to process the data. These two memories work alternatively in write and read mode, with an automaton managing the sequencing. Each memory is organized in a matrix and, for a code with a length $n_1 n_2$ and a quantification of the data on q bits, it is formed by memory arrays of $q.n_1 n_2$ bits each.

a) Modular Structure

In the case of a modular structure, the general organization of the circuit on a half-iteration is that of FIGS. 5 and 6.

The module 50 illustrated in FIG. 5 contains a processing unit 40 (as illustrated in FIG. 4) and four memories:
 a storage memory 51 containing the data [R];
 a processing memory 52 containing the data [R];
 a storage memory 53 containing the data [W](or [R'] depending on the processing unit); and
 a processing memory 54 containing the data [W](or [R']).

The data [R] 57$_1$ (and [W] 57$_2$ respectively) encoded on q bits which reach the storage module 50 are arranged along the rows of the reception memory 51 (and 53 respectively) working in write mode, the logic switch 55$_1$ (and 55$_3$ respectively) at input of the memory 51 (and 53 respectively) (implemented, for example in the form of an addressing bit enabling the selection of the memory 51 (and 53 respectively) during a write operation) being then closed and the switch 56$_1$ (and 56$_3$ respectively) at input of the memory 52 (and 54 respectively) being open. The data [R] at input of the first module come directly from the transmission channel while the data [R] of each of the following modules come from the output [R] 59$_1$ of the previous module. The data [W] at input of the first module are zeros while the data [W] of each of the next modules come from the output [W] 59$_2$ of the previous module.

The data of the matrix received previously are read out along the columns of the processing memories-52 and 54 which, for its part, works in read mode, the logic switch 56$_2$ (and 55$_4$ respectively) at output of the memory 52 (and 54 respectively) (implemented, for example in the form of an addressing bit enabling the selection of the memory 52 (and 54 respectively) during a read operation) being then closed and the switch 56$_2$ (and 56$_4$ respectively) at output of the memory 51 (and 53 respectively) being open.

Once the reception memories are filled, the processing memories go into write mode (in other words, the roles of the memories 51 and 52 (53 and 54 respectively) are exchanged, and the logic switches 55$_1$, 55$_2$, 55$_1$, and 56$_2$ (and 55$_3$, 55$_4$, 56$_3$ and 56$_4$ respectively) "change position") in order to store the data corresponding to the next code word. By cascading two modules, one for the decoding of the columns and the other for the decoding of the rows of an encoded matrix, a full iteration is performed.

The memories 51, 52, 53 and 54 may be designed without difficulty from typical row/column-addressable single-port RAMs (Random Access Memories). Other approaches (for example using shift registers) may be envisaged, but they take up more space.

It is noted that the data exchanged on the data bus as illustrated in FIG. 5 are encoded on q bits while, in a variant illustrated in FIG. 6, the data are encoded on 2.q bits, each of the data then containing q bits corresponding to a piece of data [R] and q bits corresponding to a piece of data [W] (or [R']).

The module 60 illustrated in FIG. 6 makes it possible to perform a decoding half-iteration and contains a processing unit 40 (as illustrated with reference to FIG. 4) and two memories:
 a storage or reception memory 62 containing the data [R] and [W](or [R'] if the processing unit is like the unit 30 illustrated in FIG. 3); and
 a processing memory 63 containing the data [R] and [W] (or [R']).

The data 61 encoded on 2.q bits which arrive at the decoding module are arranged in order along the rows of the reception memory 62 working in write mode. In parallel, the data of the matrix received earlier are picked up along the columns of the processing memory 62, which itself works in read mode. Once the reception memory 62 is filled, the processing memory goes into write mode in order to store the data corresponding to the next code word. By cascading two modules, one for the decoding of the columns and the other for the decoding of the rows of an encoded matrix, a full iteration is performed.

The memories 62, 63 may be designed without difficulty from typical row/column-addressable single-port RAMs (Random Access Memories). Other approaches (for example using shift registers) may be envisaged, but they take up more space.

From a practical point of view, the modular approach has the advantage of enabling high operating frequency and of being very flexible in its use. As a trade-off, the cascade-connection of several modules leads to an increase in the latency and the amount of space taken up by the circuit. These parameters soon constitute an essential defect when there is an increase in the number of iterations and/or the length of the code.

b) The Structure known as the Von Neumann Structure

This time, the circuit carries out several iterations in using four storage units 70, 71, 72 and 73 illustrated in FIG. 7. The decoding module is looped back to itself. With this architecture, the full circuit has only four memories 70, 71, 72 and 73, independently of the number of iterations performed. However, these memories 70, 71, 72 and 73 should be capable of being read and written by row/column addresses.

The memories 70, 71, 72 and 73 are typical single-port RAMs in which it is possible to read or write a piece of data identified by its address. Since each sample is accessed directly, the matrix can be decoded along either its rows or its columns. The memories are similar to those chosen for the modular solution. However, since the full circuit has only four of them, the gain in surface area is considerable (80% for four iterations). It must be noted however that this reduction in surface area is obtained, for a same speed of operation of the circuits, to the detriment of the data throughput rate (divided by at least it for it/2 iterations: it is indeed necessary, in this computation of the latency, to take account of each elementary decoding).

The data [R] 76 (and [W] 75 respectively) encoded on q bits are arranged in order along the rows of the reception memory 70 (and 72 respectively) working in write mode, the logic router 77, (and 78, respectively) routing the data towards the memory 70 (and 72 respectively) (implemented, for example, in the form of an addressing bit enabling the selection of the memory 70 (and 72 respectively) during a write operation). The data [R] 76 at input directly come from the transmission channel. The data [W] at input are zeros during the first half-iteration while the data [W] of each of the following half-iterations come from the output [W] 75 of the previous half-iteration.

In parallel, the data [R] received earlier are picked up along the columns of the processing memory 71 which, for its part, works in read mode. The logic router $77_2$ at output of the memories 71 and 70 (implemented, for example, in the form of an addressing bit) enables the selection of the memory 71 during a read operation. In parallel, the data [W] coming from a previous half-iteration (or zeros if it is a first half-iteration) are picked up along the columns of the processor memory 73, which for its part works in read mode. The logic router $78_2$ at output of the memories 72 and 73 enables the selection of the memory 72 during a read operation.

Once the reception memory of [W] is filled (i.e. at the end of each operation of turbo-decoding of a block if it is assumed that the data are transmitted continuously) the roles of the processing and reception memories [W] are exchanged: the processing memory of [W] goes into write mode and becomes a reception memory (in other words, the logic routers $78_1$ and $78_2$ "change position" in order to store the data corresponding to the following code word and the reception memory of [W] goes into read mode and becomes a processing memory.

Once the reception memory of [R] is filled (i.e. at the end of each operation of turbo-decoding of a block if it is assumed that the data are transmitted continuously) the roles of the processing and reception memories of [R] are exchanged: the processing memory of [R] goes into write mode and becomes a reception memory (in other words, the logic routers $77_1$ and $77_2$ "change position" in order to store the data corresponding to the following code word and the reception memory of [R] goes into read mode and becomes a processing memory. If, as a variant, the data are transmitted in packet (or burst) mode, and if each packet is to be decoded only once, the decoding being completed before the arrival of a new packet, it is not necessary, in a Von Neumann structure, to have two processing and reception memories respectively for the data [R] but only one is enough.

The memories 70, 71, 72 and 73 used may be designed without difficulty from classic, row-addressable and column-addressable, single-port RAMs (Random Access Memories). Other approaches (for example using shift registers) may be envisaged, but they take up more space.

It may be noted that the data exchanged on the data bus, as illustrated in FIG. 7, are encoded on q bits.

It may be noted that, as a variant to the embodiments illustrated in FIGS. 5, 6 and 7, a processing unit 30 as illustrated in FIG. 3 may replace the processing unit 40. The [W] type data are then replaced by the [R'] type data in the memories.

According to the prior art, a high-throughput-rate architecture duplicates the number of modules illustrated in FIG. 6 or 7.

The invention according to its different aspects is designed especially to overcome these drawbacks of the prior art.

More specifically, it is a goal of the invention to provide a decoding module, method and device adapted to providing high performance in terms of error rate while, at the same time, limiting the surface area of the circuits needed for the processing operations (elementary decoding) and the memories.

It is another goal of the invention to provide a decoding module, method and device capable of processing high throughput rates for a given clock frequency of operation.

It is also a goal of the invention to reduce the decoding latency in a decoding module, method and device of this kind.

BRIEF SUMMARY OF THE INVENTION

These goals, as well as others that should appear here below, are achieved by means of at least one module for the decoding of a concatenated code, corresponding to at least two elementary codes, of the type implementing storage means in which data samples to be decoded are stored. According to the invention, the module comprises at least two elementary decoders for at least one of said elementary codes, the elementary decoders associated with one of said elementary codes carrying out the simultaneous processing, in parallel, of the distinct code words contained in the storage means.

Thus, the invention relies on a wholly novel and inventive approach to decoding in which, in a module, the number of decoders is duplicated without duplicating the number of storage means. This amounts to an advantage over the prior art where those skilled in the art naturally duplicate the number of memories and decoders to increase the throughput rates while it is the memory that takes up the greatest amount of space in a decoding circuit (for example, the memory can take up 80% of the total surface area of the circuit).

The invention can be applied advantageously to iterative decoders and especially to "turbo-decoders". The invention can be applied to different structures of decoders, especially Von Neumann structures (in which reception and/or data processing memories as well as processing units are used for several iterations, thus providing economies in terms of circuit surface area but, for a given speed of operation, limiting the decoding speed) and to modular structures (in which reception and/or data processing memories as well as processing units are used for a single half-iteration, thus providing a gain in decoding speed but maintaining substantial decoding latency), these structures being described in detail further below.

In general, the invention has the value of providing gain in decoding speed (this is the case especially when the invention is applied to a Von Neumann structure, speed being the main problem of the Von Neumann structure) and/or a gain in decoding latency (this is the case especially when the invention is applied to a modular structure), while at the same time maintaining a relatively small circuit surface area.

Thus, the invention can be used to obtain high data transmission rates.

According to an advantageous characteristic, the storage means storing said data to be decoded being organized in the form of a matrix of $n_1$ rows, each containing an elementary code word, and $n_2$ columns, each containing an elementary code word, the decoding module comprises $n_1$ (and respectively $n_2$) elementary decoders each supplied by one of the rows (and columns respectively) of the matrix.

In other words, the invention can advantageously be applied to serial concatenated codes.

According to a particular characteristic of the invention, the storage means storing said data to be decoded is organized in the form of a matrix of $n_1$ rows including $k_1$ rows, each containing an elementary code word, and $n_2$ columns including $k_2$ columns, each containing an elementary code word, and furthermore the decoding module is distinguished in that it comprises $k_1$ (and respectively $k_2$) elementary decoders each supplied by one of the rows (and columns respectively) of the matrix.

Thus the invention can advantageously be applied to parallel concatenated codes.

The invention also enables a parallel decoding of the rows (and columns respectively) of a matrix corresponding to the code used, thus improving the decoding speed or reducing the latency, while at the same time maintaining a relatively small circuit surface area, the elementary decoders generally requiring a small circuit surface area (or in general, a small number of transistors) as compared with the surface area needed for the data reception and processing memories.

According to a preferred characteristic of the invention, the storage means are organized so as to enable simultaneous access to at least two elementary code words.

Thus, data corresponding to at least two code words can be processed in parallel during elementary decoding operations, enabling a gain in speed and/or a reduction of the latency.

Advantageously, the storage means are of the single-port RAM type.

Thus, the invention enables the use of current memories that do not provide for access to data stored at two distinct addresses and it does not necessitate the use of multiple-port memories (even if it does not prohibit such use).

The storage means is preferably organized in compartments, each possessing a single address and each containing at least two pieces of elementary data of an elementary code.

Thus, the invention enables access to a single memory compartment containing at least two pieces of elementary data (generally binary data which may or may not be weighted), these data being possibly used simultaneously by at least two elementary decoders. This provides simultaneous access to data whose contents are independent and thus limits the operating frequency (and hence the consumption) of the storage circuits while having a relatively high overall decoding speed.

According to an advantageous characteristic, the decoding module enables simultaneous access to m elementary code words and l elementary code words, m>1 and/or l>1 enabling the simultaneous supply of at least two elementary decoders.

Thus the invention enables the utmost advantage to be gained from the subdivision into elementary codes while the same time providing an elementary decoder associated with each elementary code. The invention thus optimizes the speed of decoding and/or the latency.

According to a particular characteristic, the simultaneously accessible words correspond to adjacent rows and/or adjacent columns of an initial matrix with $n_1$ rows and $n_2$ columns, each of the adjacent rows and/or columns containing an elementary code word.

According to a particular embodiment, the elementary codes are the same code.

Thus, the invention optimizes the decoding speed and/or the latency when the elementary codes are identical.

Advantageously, the decoding module is designed so as to carry out at least two elementary decoding operations.

According to a first embodiment, the concatenated code is a serial concatenated code.

According to a second embodiment, the concatenated code is a parallel concatenated code Thus, the invention can be equally well be applied to these two major types of concatenated codes.

The invention also relates to a device for the decoding of a concatenated code, implementing at least two modules of the kind described further above, each carrying out an elementary decoding operation.

The invention also relates to a method for the decoding of a concatenated code, corresponding to two elementary codes, and comprising at least two simultaneous steps for the elementary decoding of at least one of said elementary codes, supplied by the same storage access.

According to an advantageous characteristic, the decoding method is remarkable in that the storage means are organized so that a single access to an address of the storage means provides access to at least two elementary code words, so as to simultaneously supply at least two of the elementary decoding steps.

According to a particular embodiment, the decoding method is iterative.

Preferably, at least some of the processed data are weighted.

Thus, the invention is advantageously used in the context of "turbo-codes" which especially provide high performance in terms of residual error rate after decoding.

The advantages of the decoding devices and methods are the same as those of the decoding module, and are therefore not described in fuller detail.

BRIEF DESCRIPTION OF THE DRAWINGS

Other characteristics and advantages of the invention shall appear more clearly from the following description of the preferred embodiment, given by way of a simple and non-restrictive exemplary illustration, and from the attended drawings, of which.

DETAILED DESCRIPTION OF PREFERRED EMBODIMENTS

The general principle of the invention relies on a particular architecture of the memories used in an operation of concatenated code decoding and more particularly the decoding of these codes.

The concatenated codes are decoded iteratively by decoding first of all each of the elementary codes along the rows and then each of the elementary codes along the columns.

Figure 1:
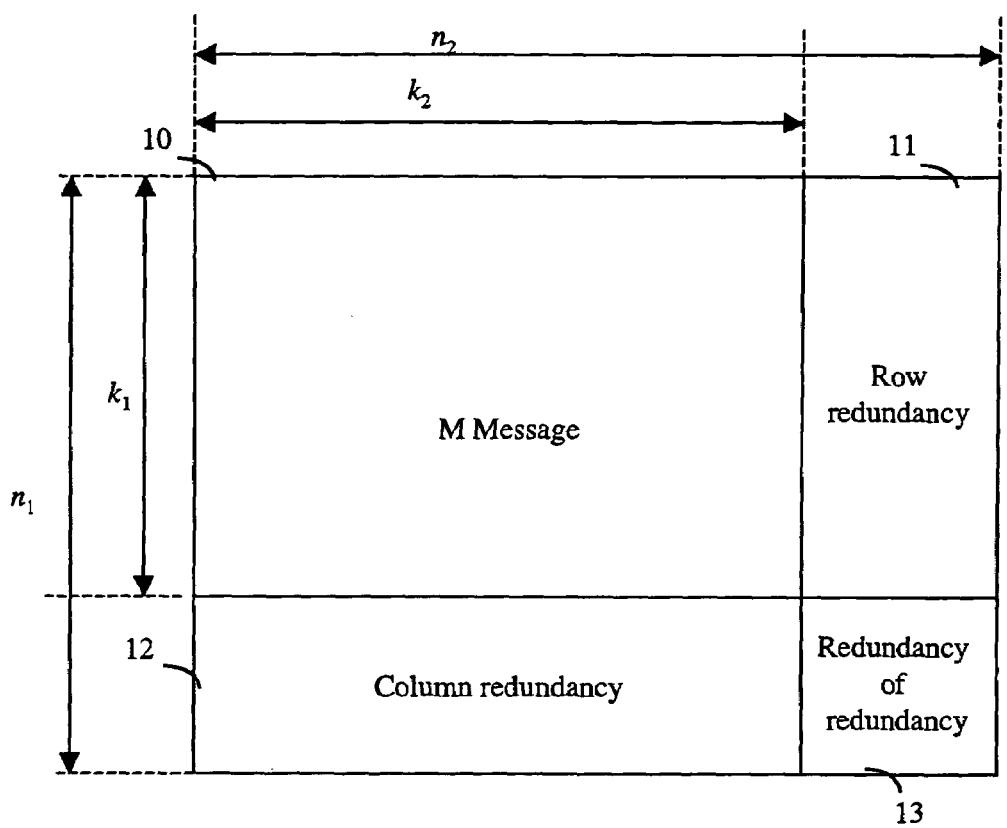
FIG. 1 shows a structure of a matrix representing, in a conventional manner, a product code word or block "turbo-code"
Figure 2:
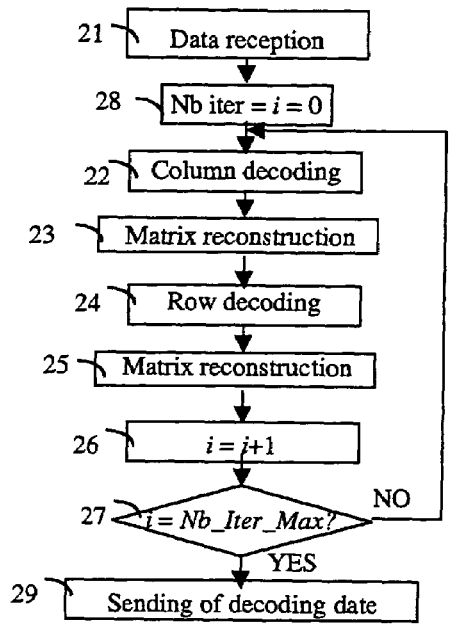
FIG. 2 is a block diagram of the decoding of a block "turbo-code" known per se.

According to the invention, to improve the decoding bit rate, the elementary decoders are parallelized:

to decode (see FIG. 1) the $n_1$ rows, $m_1$ ($2 \leq m_1 \leq n_1$) elementary decoders of the code $C_2$ are used, and/or to decode the $n_2$ columns, $m_2$ ($2 \leq m_2 \leq n_2$) elementary decoders of the code $C_1$ are used.

Each elementary decoder has input data coming from a reception and/or processing memory and gives output data that is kept in a reception and/or processing memory. In order to further improve the decoding throughput rate while maintaining a circuit clock speed that continues to be reasonable, several pieces of data at input or output of the decoder are assembled in a single memory compartment. Thus, by grouping together for example four pieces of elementary data (each of the pieces of elementary data corresponding to a piece of binary data that may or may not be weighted) in a single memory compartment and by demultiplexing (and respectively multiplexing) these pieces of data at input (and output respectively) of the decoders or output (and input respectively) of the memories, the data bit rate at input and output of the memory is quadrupled for a given circuit clock speed, thus achieving an overall increase in the decoding speeds and/or reducing the latency.

The invention can be applied in the same way to parallel concatenated codes.

The invention proposes a novel approach particularly suited to a high-throughput-rate architecture of a "turbo-decoder" of concatenated codes.

It has been seen that the concatenated codes possess the property of having code words on all the rows (or columns) of the initial matrix C.

Figure 3:
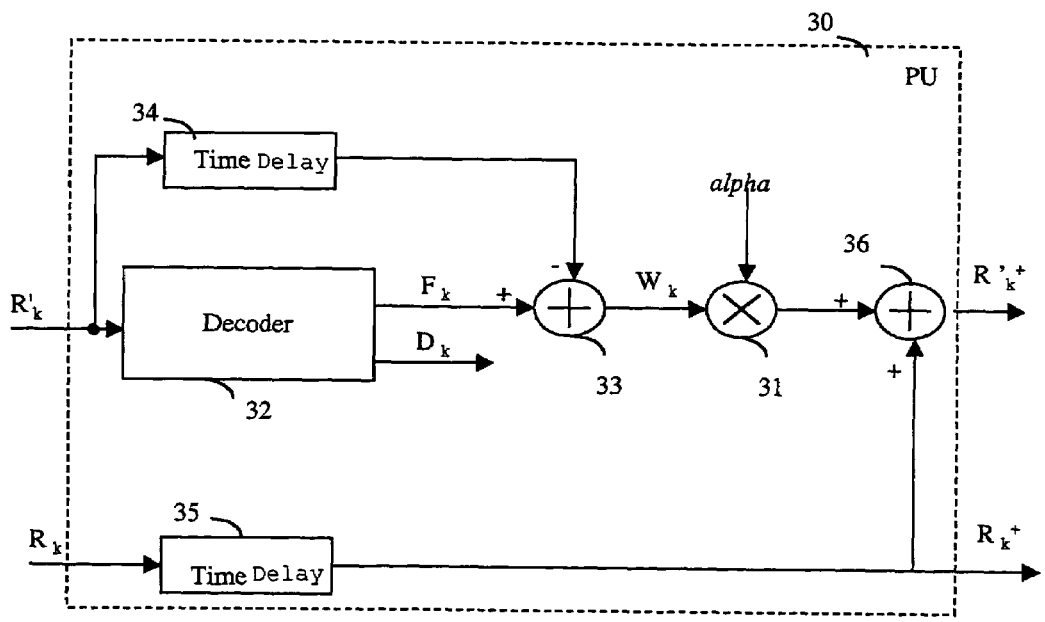
FIG. 3 is a block diagram of a processing unit that carries out to a half-iteration of "turbo-decoding", also known per se.
Figure 4:
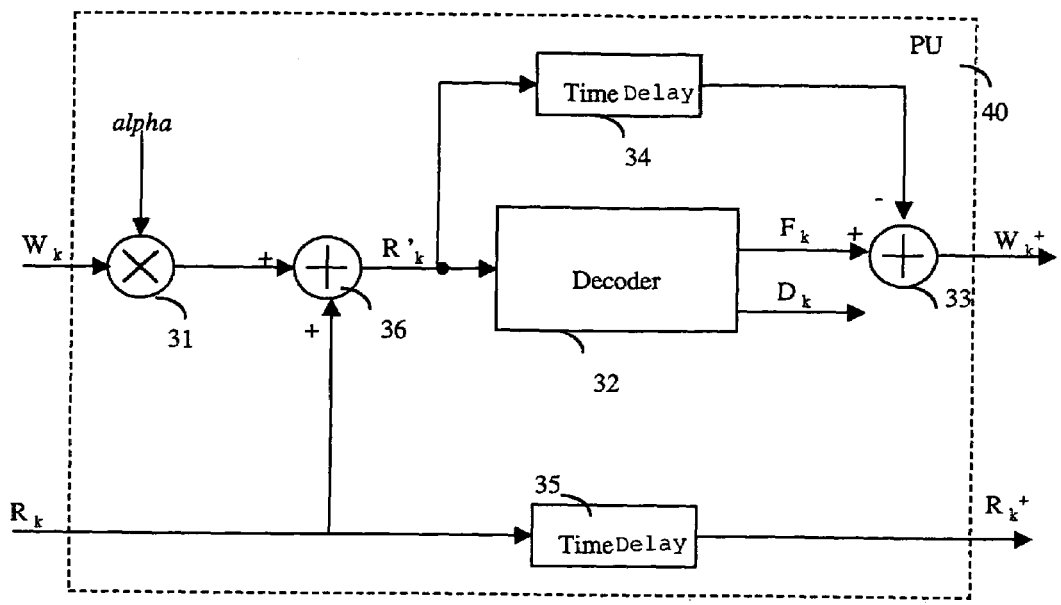
FIG. 4 is a block diagram of a processing unit that carries out a half-iteration of "turbo-decoding", also known per se.
Figure 5:
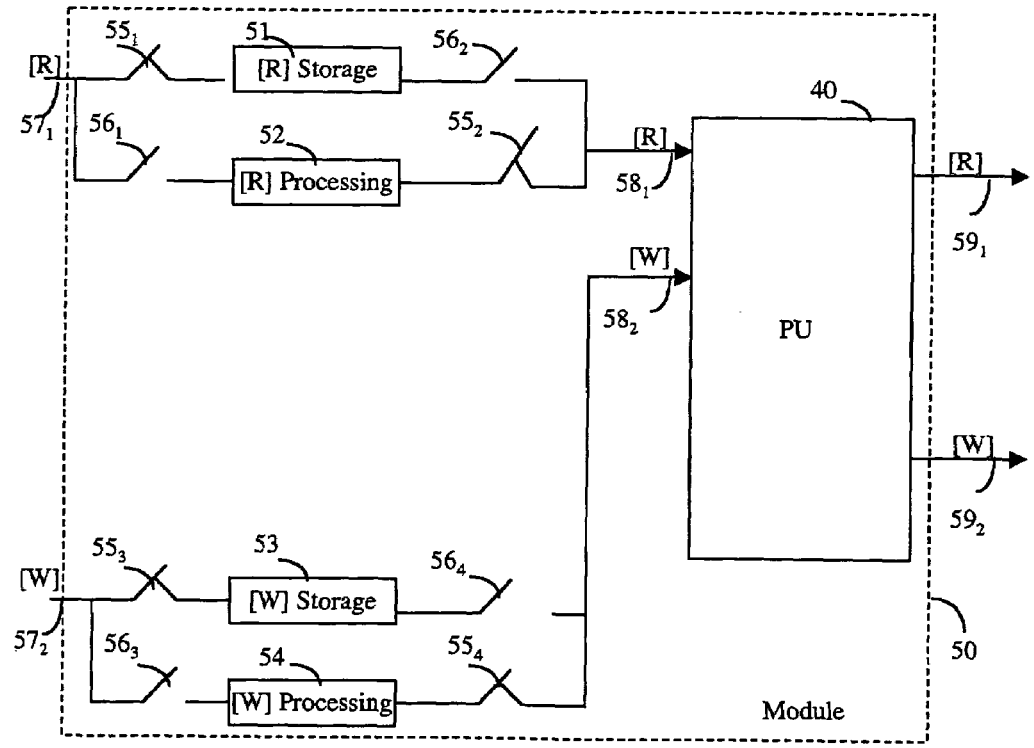
FIG. 5 is a block diagram of a turbo-decoder module in a modular structure according to the prior art.
Figure 6:
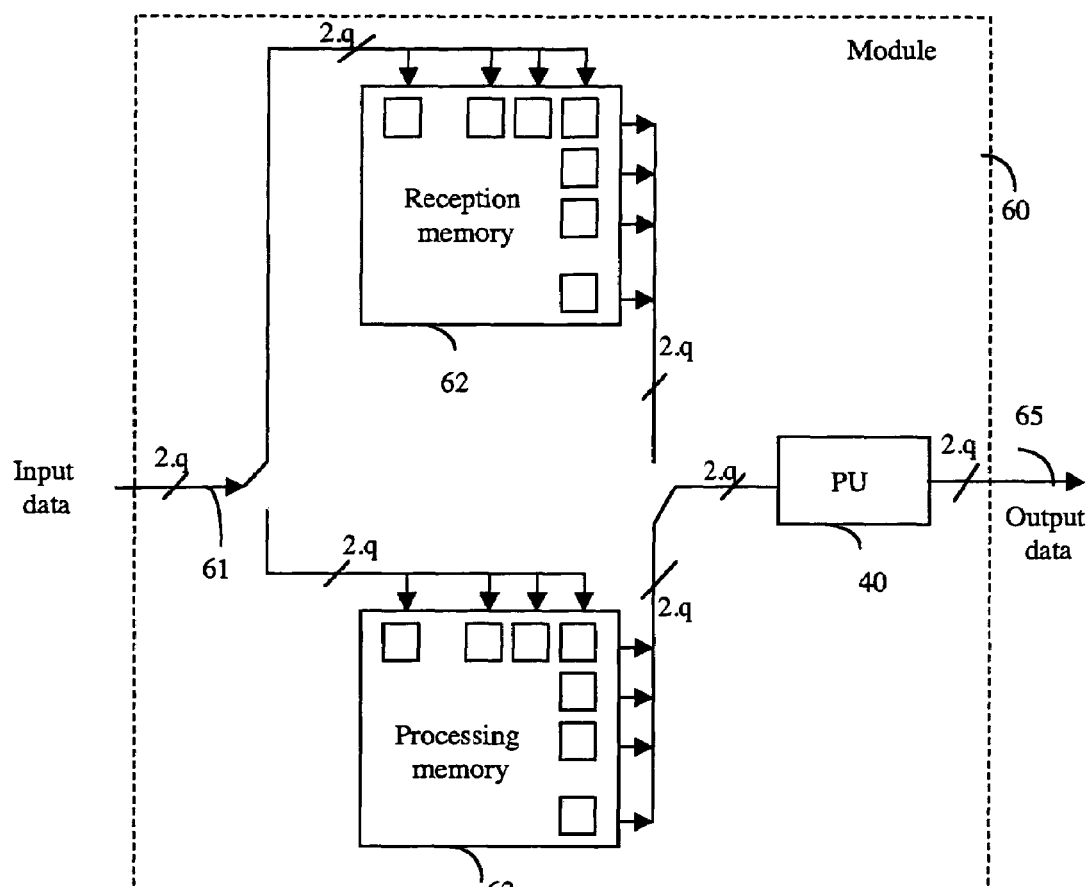
FIG. 6 is a block diagram of a turbo-decoder module in a modular structure showing the structure of the memories, according to the prior art.
Figure 8:
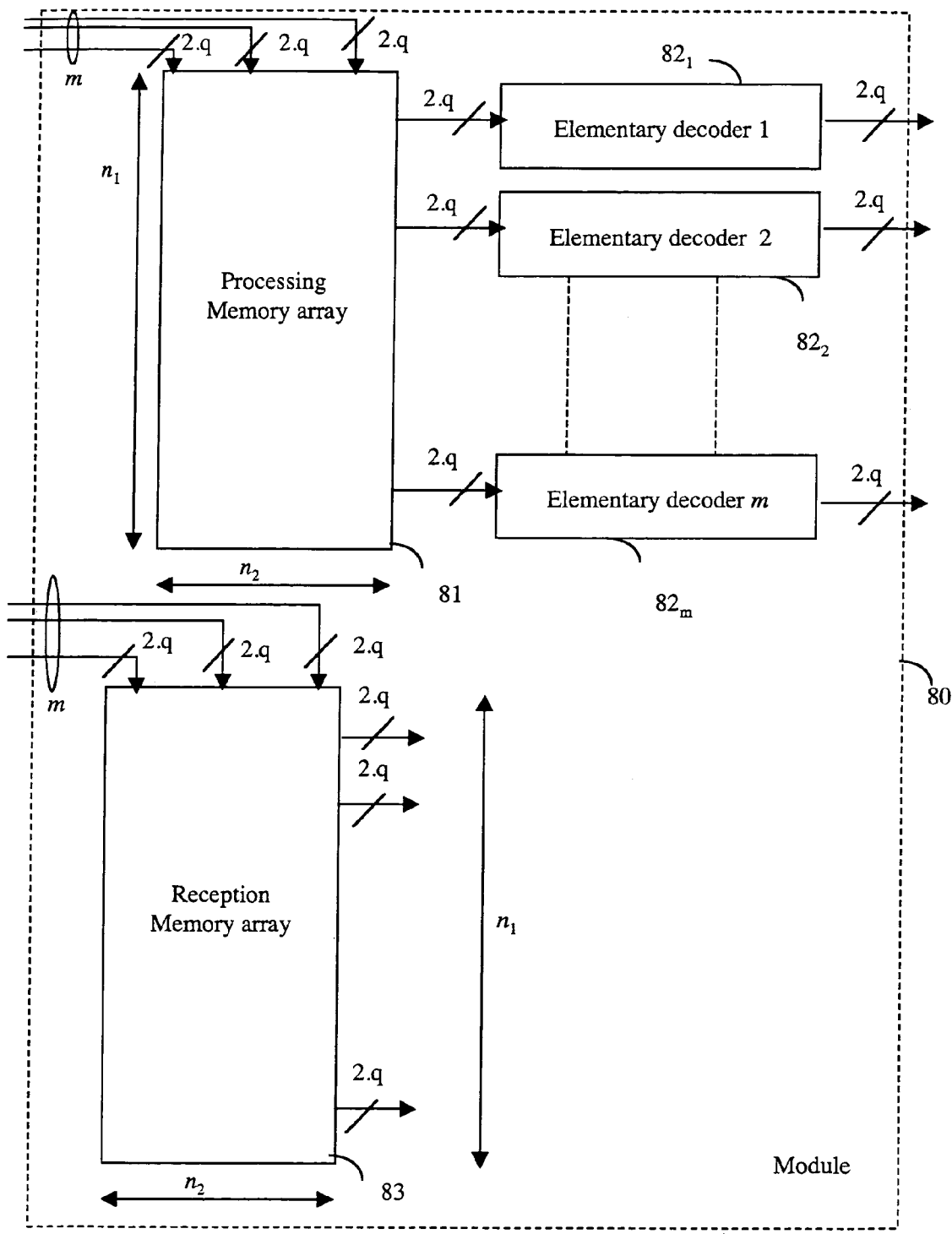
FIG. 8 is a block diagram of a decoder adapted to high throughput rates with parallelization of decoders, according to the invention in a first particular embodiment.

According to the invention, the decoding is parallelized according to the principle illustrated in FIG. 8, illustrating a module 80 used to perform a half-iteration, where the modules 80 can be cascaded to form a modular turbo-decoding structure. The matrix 81 (processing memory array of $n_1.n_2$ samples of 2q bits containing data [R] and [W] (or [R'] depending on the type of processing unit) supplies a plurality of elementary decoders (or processing unit 30 or 40 as illustrated with reference to FIGS. 3 and 4) $82_1$ to $82_m$.

Indeed, the number of elementary decoders of the code $C_1$ (or $C_2$) has been duplicated as m elementary decoders $82_1$ to $82_m$. It is thus possible to process a maximum number of $n_1$ (or $n_2$) code words, provided however that the read or write memory access operations take place at different instants (it is not possible to read several memory cells of a matrix at the same time unless "multiple-port" RAMs are used). With this constraint being met, it is possible to gain one factor $n_2$ (or $n_1$) in the ratio $F_{throughput\ rate}/F_{PUmax}$ ($F_{throughput\ rate}$ being the useful throughput rate at output of the turbo decoder and $F_{PUmax}$ representing the speed of operation of a processing unit) since there may be $n_2$ (or $n_1$) samples processed at a given point in time.

The matrix 83 (reception memory array of $n_1.n_2$ samples of 2q bits) is supplied by a plurality of elementary decoders $82_1$ to $82_m$ of a previous module 80.

It may be noted that, in the first module, the data [R] come directly from the channel while the data [W] are zero (or, as a variant, the invention uses only a half-bus corresponding to the data [R], at input of the elementary decoders in the first module).

At each half-iteration, the respective roles of the memories 81 and 83 are exchanged, these memories being alternatively processing memories or reception memories.

It will be noted that the data are written along the columns of the reception memory arrays whereas they are read along the rows in the processing memory arrays. Thus, advantageously, an interleaving and de-interleaving means is obtained. This means is easy to implement (if the interleaver of the turbo-coder is uniform, i.e. in the interleaver, the data are written row by row and read column by column) by cascading the modules, the outputs of the elementary decoders of a module being connected to the reception memory array of the following module.

The major drawback of this architecture is that the memories 81 and 83 must work at a frequency m. $F_{PUmax}$, if we have m elementary decoders in parallel.

According to a first variant of the modular structure, the matrix 81 is divided into two processing memory arrays of $n_1.n_2$ samples of q bits, the two arrays respectively containing data [R] or [W](or [R'] according to the type of processing unit). Furthermore, the matrix 83 is itself divided into two reception memory arrays of $n_1.n_2$ samples of q bits respectively containing data [R] or [W].

Figure 7:
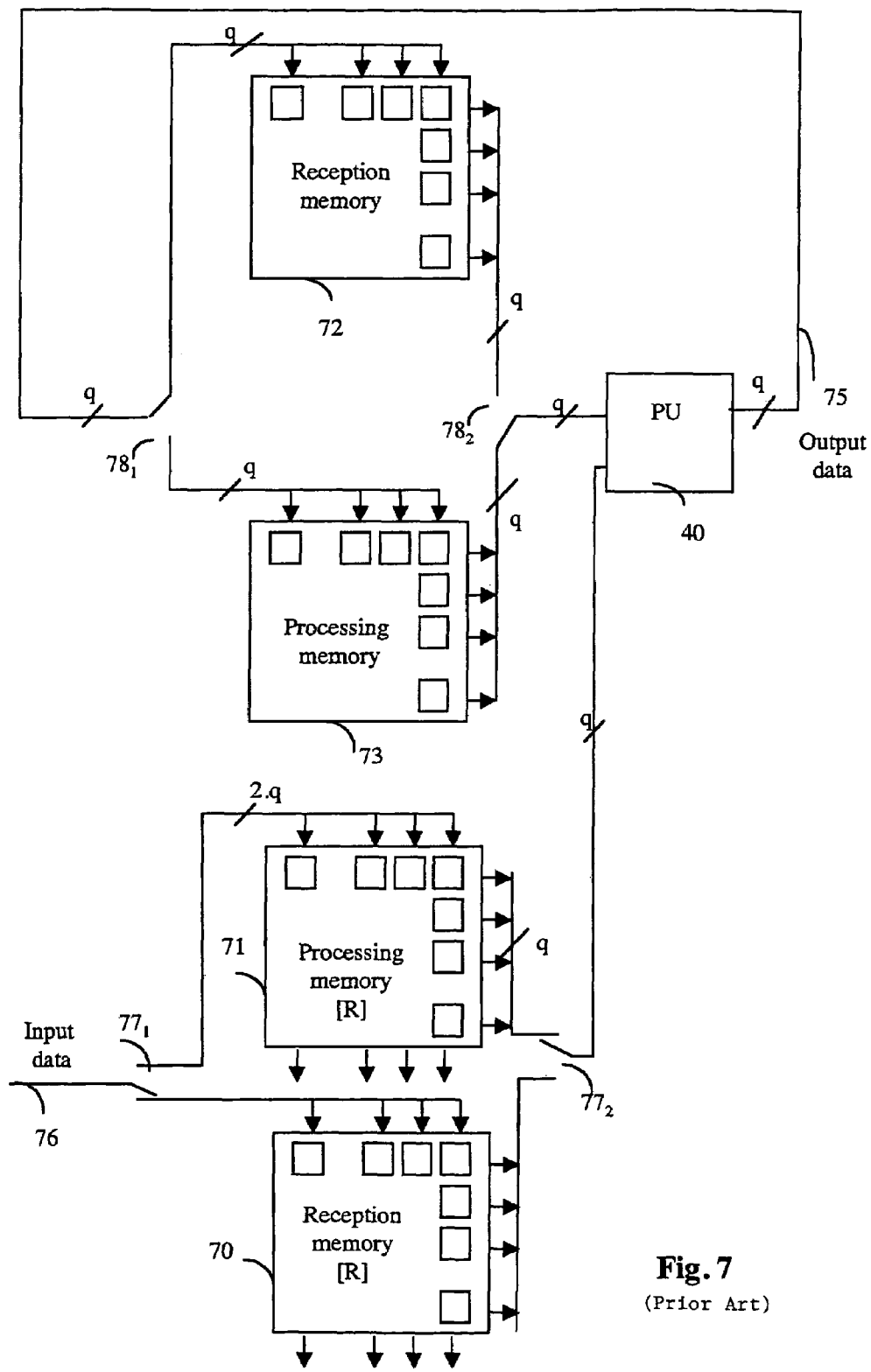
FIG. 7 is a block diagram of a turbo-decoder module in a Von Neumann structure, revealing the structure of the memories, according to the prior art.

As a variant, the <<turbo-decoder>> is made according to a Von Neumann structure. According to this variant, the processing memory array is divided into a processing memory array associated with the data [R] (if it is assumed that the data are transmitted continuously) and a processing memory array associated with the data [W](or [R'] according to the embodiment of the processing unit). Similarly, the processing memory array is divided into a reception memory array associated with the data [R] and a reception memory array associated with the data [W]. Just as in the structure illustrated in FIG. 7, the roles of the data [R] processing and reception memories are exchanged at each half-iteration and the roles of the data [W] processing and reception memories are exchanged at each block turbo-decoding operation. It is noted however that, according to the invention, in a Von Neumann structure, the data [R] and [W] processing memories supply m elementary decoders and that the outputs [W] of these decoders are looped back to the data [W] reception memory. According to this alternative embodiment, if the data are transmitted in packet (or burst) mode, and if each packet has to be decoded in only one operation, the decoding being completed before the arrival of a new packet, it is not necessary to have two processing and reception memories respectively for the data [R] but only one memory is sufficient.

Figure 10:
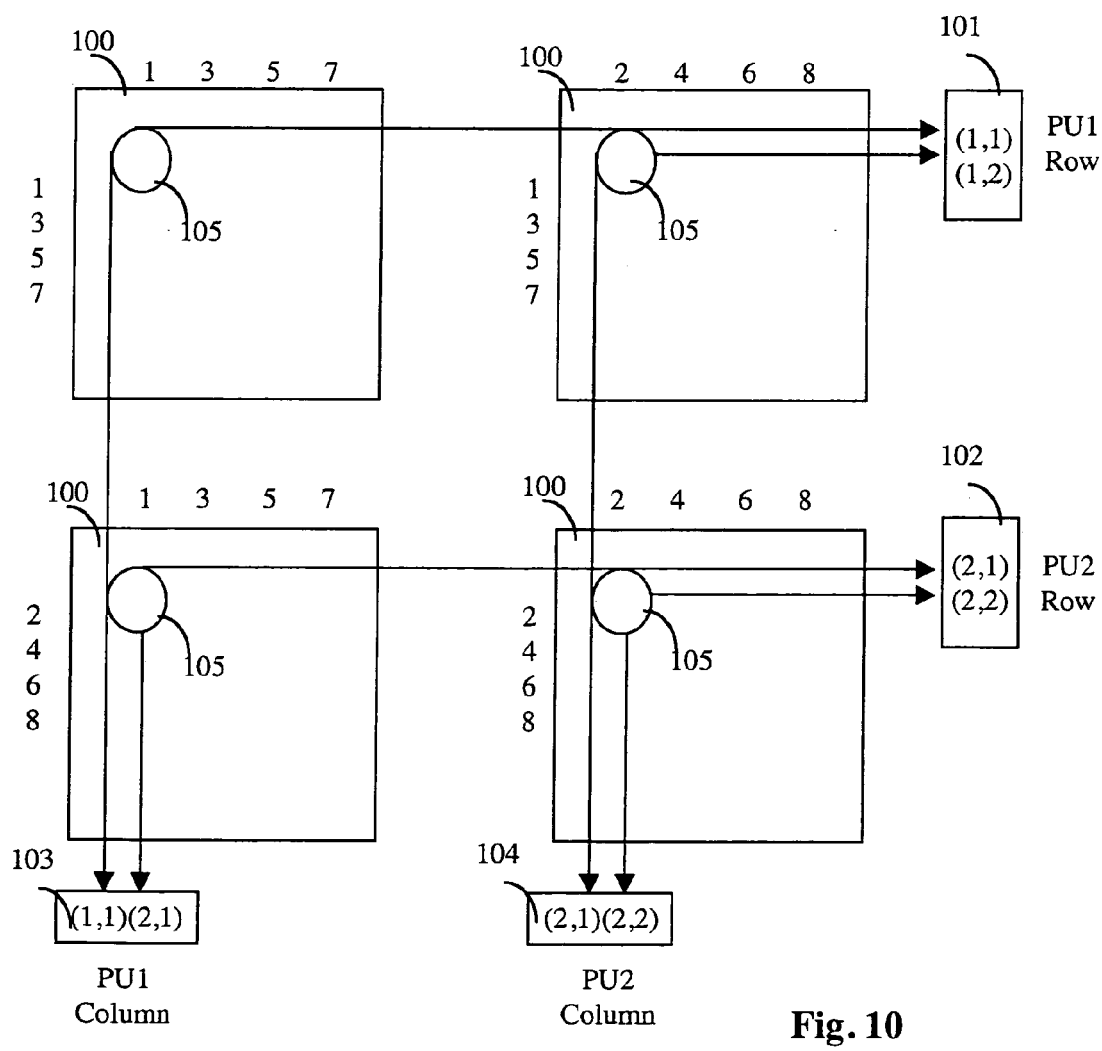
FIG. 10 is a diagrammatic view of a memory compartment with its assignment to processing units, in conformity to the invention according to a variant of a particular embodiment.

According to an advantageous aspect of the invention, it is possible to keep a same speed of operation of the memory and increase the throughput rate, in storing several pieces of data at a same address according to the principle illustrated in FIG. 10. However, it is necessary to be able to use this data in rows as well as in columns. This results in the following organization: this address will have data adjacent in reading (or writing) both in rows and in columns.

Figure 9:
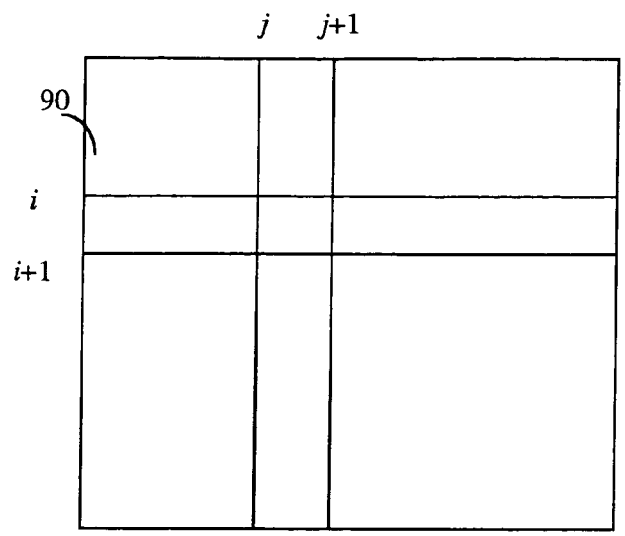
FIG. 9 is a diagrammatic view of a memory compartment according to the invention in a second particular embodiment.

Let us consider two adjacent rows i and i+1 and two adjacent columns j and j+1 of the initial matrix 90, shown in FIG. 9.

The four samples (i,j), (i,j+1), (i+1,j) and (i+1,j+1) constitute a word 105 of the new matrix 100, illustrated in FIG. 10, which has four times fewer addresses (I,J) but four times more words. If $n_1$ and $n_2$ are even parity values,

| then | if $1 \leq I \leq n_1/2$, | $i = 2*I - 1$. |
|---|---|---|
| Similarly, | if $1 \leq J \leq n_2/2$, | $j = 2*J - 1$. |

For the row decoding, the samples (i,j), (i,j+1) 101 are assigned to a processing unit PU1, (i+1,j) and (i+1,j+1) 102 to a processing unit PU2. For the column decoding, we must take (i,j), (i+1,j) 103 for PU1 and (i,j+1), (i+1,j+1) 104 for PU2. If the processing units are capable of processing these pairs of samples at input (reading of the RAM) and output (writing of the RAM) in the same period of time $1/F_{PUmax}$, the processing time of the matrix is four times smaller than it is for the initial matrix (FIG. 10).

This FIG. 10 of course shows only an exemplary <<subdivision>> of the memory into four parts.

To generalize the point, if a word 105 of the new matrix 100 contains m samples of a row and l samples of a column, the processing time of the matrix is m.l times faster with only m processing units of the "row" decoding and l processing units of the "column" decoding.

Figure 11:
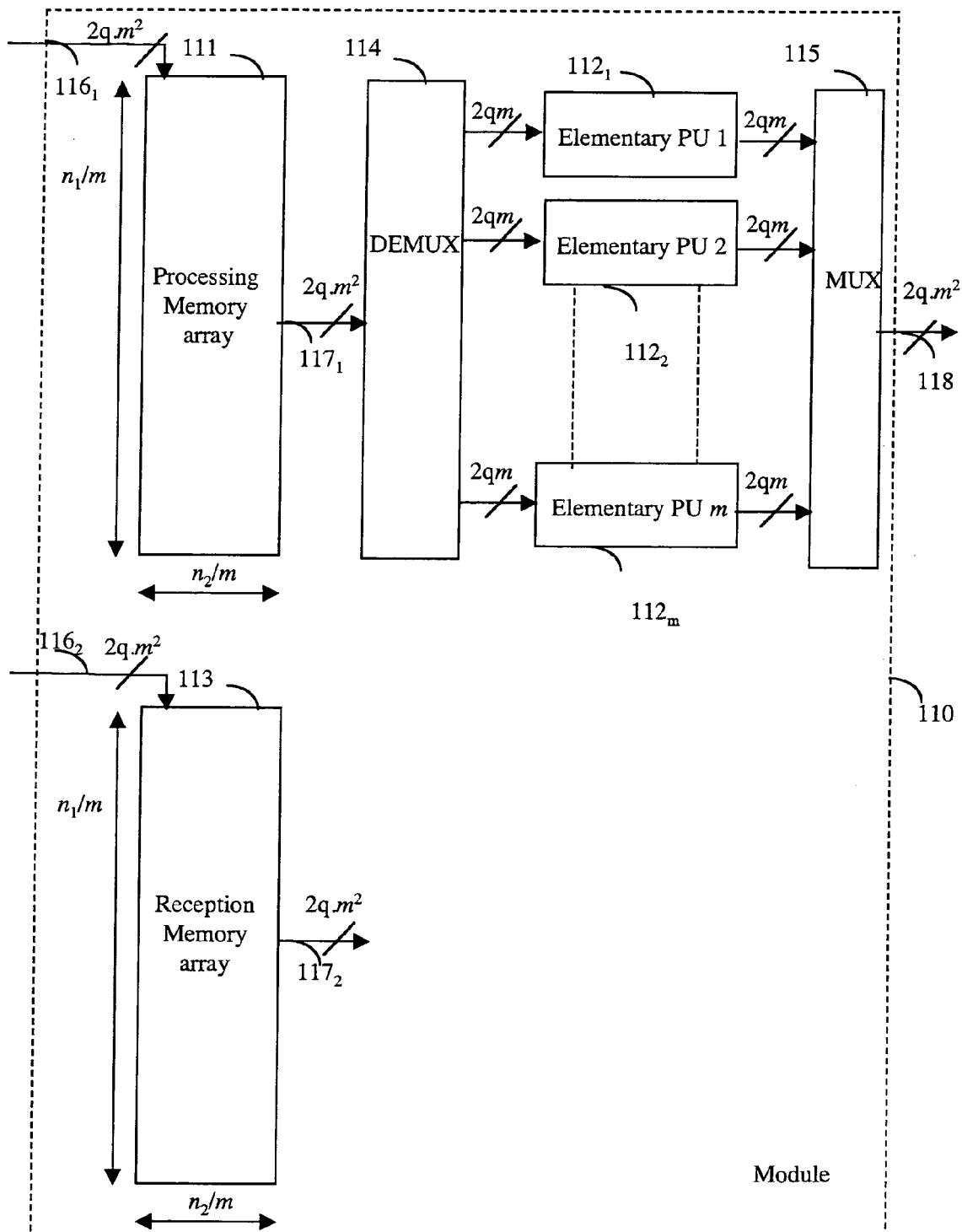
FIG. 11 is a block diagram of a turbo-decoder, in accordance with the invention according to an alternative of a particular embodiment.

Should the codes $C_1$ and $C_2$ be identical, the <<row>> PUs and the <<column>> PUs are identical too, as can be seen in FIG. 11. Then, m=l and m processing units $112_1$ to $112_m$ are necessary (such as the processing units 30 or 40 illustrated in FIGS. 3 and 4). A demultiplexer 114 delivers the data of the matrix 111 (processing memory array with $n1n2/m^2$ words of $2q.m^2$ bits) to the m elementary processing units (PU) $112_1$ to $112_m$, each of the processing units simultaneously receiving a 2qm bit sample.

A multiplexer 115 is supplied with samples of 2qm bits by the elementary decoders $112_1$, to $112_m$. The multiplexer 115 then supplies samples of $2q.m^2$ bits to the reception memory array 13 of the module corresponding to the next half-iteration.

This organization of data matrices requires neither special memory architectures nor higher speed. Furthermore, if the complexity of the PU remains smaller than $m^2$ times that of the previous PU, the total complexity is smaller for a speed $m^2$ times higher (this result could have been obtained by using $m^2$ PU, as proposed in FIG. 8).

The memory has $m^2$ times fewer words than the initial matrix C. For identical technology, its access time will therefore be shorter.

The invention therefore proposes an architecture for the decoding of concatenated codes, working at high throughput rate. These codes may be obtained from convolutive codes or from linear block codes. The invention essentially modifies the initial organization of the memory C in order to accelerate the decoding speed. During a period of time $1/F_{PUmax}$, m samples are processed in each of the m elementary decoders. This gives a gain of $m^2$ in throughput rate. If the processing of these m samples does not considerably increase the surface area of the elementary decoder, the gain in surface area is close to m, when this solution is compared to the one requiring $m^2$ decoders.

According to one variant, the demultiplexer 114 demultiplexes each of the samples of $2q.m^2$ bits received from the memory array 111 and serializes them to obtain m sequences of m samples of 2q bits. Each of these sequences is delivered to one of the elementary processing units $112_1$ to $112_m$. Each of the processing units $112_1$ to $112_m$ then supplies the multiplexer 115 with sequences of samples of 2q bits. The multiplexer processes the m sequences coming simultaneously from the processing units $112_1$ to $112_m$ to supply samples of $2q.m^2$ bits to the reception memory array 113 of the module corresponding to the next half-iteration. This variant gives a decoding speed m times higher than the speed obtained in the prior art, for equal clock speed, with only one processing memory array in each module.

According to the embodiments described with reference to FIG. 11, with the memory arrays 111 and 113 containing data encoded on $2q.m^2$ bits, the number of words of the reception and processing memories is smaller and the access time to these memories is reduced.

Naturally, the invention is not limited to the exemplary embodiments mentioned here above.

In particular, those skilled in the art can provide any variant to the type of memory used. These may be, for example, single-port RAMs or multiple-port RAMs.

Furthermore, the invention can equally well be applied to the case where the data is transmitted in packet (or burst) mode or continuously.

Furthermore, the invention also relates to serial or parallel concatenated codes, these codes possibly being of the convolutive code or block code type.

The invention relates to codes formed by two concatenated codes but also relates to codes formed by more than two concatenated codes In general, the invention also relates to all "turbo-codes", whether they are block turbo-codes or not, formed by elementary codes acting on an information sequence (whether permutated or not), at least one of the elementary code words being constituted by at least two code words.

The invention claimed is:

1. Module for the decoding of a concatenated code, corresponding to at least two elementary codes, the module comprising:
   storage means in which data samples to be decoded are stored, wherein said storage means is organized in the form of a matrix of $n_1$ rows, each containing a code word of said elementary codes, and $n_2$ columns,
   $n_1$ and respectively $n_2$ elementary decoders, said elementary decoders associated with one of said elementary codes carrying out the simultaneous processing, in parallel, of the distinct code words contained in said storage means, said storage means being organized in compartments, each containing a single address and each containing at least two pieces of elementary data corresponding to an elementary code word, said elementary decoders each being supplied by one of the rows and columns respectively of said matrix.

2. Decoding module according to claim 1, wherein the elementary codes are the same code.

3. Decoding module according to claim 1, wherein module carries out least two elementary decoding operations.

4. Decoding module according to claim 1, characterized in that wherein the concatenated code is a serial concatenated code.

5. Decoding module according to claim 1, wherein said concatenated code is a parallel concatenated code.

6. Device for the decoding of a concatenated code, wherein the device implements at least two modules according to claim 1, cascade-mounted and each carrying out an elementary decoding operation.

7. Decoding module according to claim 1, wherein said storage means is organized so as to enable simultaneous access to at least two elementary code words.

8. Decoding module according to claim 7, wherein said storage means is of the single-port RAM type.

9. Decoding module according to claim 7, wherein each said compartment of said storage means has a single address and contains m times 1 units of elementary data enabling simultaneous supply to be made to:
  m elementary decoders along said rows; and/or
  1 elementary decoders along said columns;
  m and 1 being integers strictly greater than 1.

10. Decoding module according to claim 7, wherein said simultaneously accessible words correspond to adjacent rows and/or adjacent columns of said matrix.

11. Method for the decoding of a concatenated code, corresponding to two elementary codes, wherein the method comprises:
  $n_1$ and respectively $n_2$ simultaneous steps, each step for the elementary decoding of at least one of said elementary codes, supplied by a same storage means, said storage means being organized so that a single access to an address of said storage means gives access to data of at least two elementary code words, so as to simultaneously supply at least two of said elementary decoding steps, said storage means storing said data to be decoded being organized in the form of a matrix of $n_1$ rows, each containing a code word of said elementary codes, and $n_2$ columns, each containing a code word of said elementary codes, the $n_1$ and respectively $n_2$ simultaneous elementary steps of decoding each being supplied by one of the rows and columns respectively of said matrix.

12. Decoding method according to claim 11, wherein the decoding method is iterative.

13. Decoding method according to claim 11, wherein at least some of the processed data are weighted.

14. Module for the decoding of a concatenated code, corresponding to at least two elementary codes, the module comprising:
  storage means in which data samples to be decoded are stored and being organized in the form of a matrix of $n_1$ rows including $k_1$ rows, each containing a code word of said elementary codes, and $n_2$ columns including $k_2$ columns, each containing a code word of said elementary codes; and
  at least two elementary decoders, said elementary decoders associated with one of said elementary codes carrying out the simultaneous processing, in parallel, of the distinct code words contained in said storage means, said storage means being organized in compartments, each containing a single address and each containing at least two pieces of elementary data corresponding to an elementary code word, the elementary decoders including $k_1$ and respectively $k_2$ elementary decoders, each being supplied by one of the rows and columns respectively of said matrix.

15. Module according to claim 14, wherein the elementary codes are the same code.

16. Decoding module according to claim 14, wherein the module carries out least two elementary decoding operations.

17. Decoding module according to claim 14, wherein the concatenated code is a serial concatenated code.

18. Decoding module according to claim 14, wherein said concatenated code is a parallel concatenated code.

19. Device for the decoding of a concatenated code, wherein the device implements at least two modules according to claim 14, cascade-mounted and each carrying out an elementary decoding operation.

20. Decoding module according to claim 14, wherein said storage means is organized so as to enable simultaneous access to at least two elementary code words.

21. Decoding module according to claim 20, wherein said storage means is of the single-port RAM type.

22. Decoding module according to claim 20, wherein each said compartment of said storage means contains m times 1 units of elementary data enabling simultaneous supply to be made to:
  m elementary decoders along said rows; and/or
  1 elementary decoders along said columns;
  m and 1 being integers strictly greater than 1.

23. Decoding module according to claim 20, wherein said simultaneously accessible words correspond to adjacent rows and/or adjacent columns of said matrix.

24. Method for the decoding of a concatenated code, corresponding to two elementary codes, wherein the method comprises:
  at least two simultaneous steps, each step for the elementary decoding of at least one of said elementary codes, supplied by the same storage means, said storage means being organized so that a single access to an address of said storage means gives access to data of at least two elementary code words, so as to simultaneously supply at least two of said elementary decoding steps, said storage means storing said data being organized in the form of a matrix of $n_1$ rows including $k_1$ rows, each containing a code word of said elementary codes, and $n_2$ columns including $k_2$ columns, each containing a code word of said elementary codes, wherein $k_1$ and respectively $k_2$ f the steps for the elementary decoding each being supplied by one of the rows and columns respectively of said matrix.

25. Decoding method according to claim 24, wherein the decoding method is iterative.

26. Decoding method according to claim 24, wherein at least some of the processed data are weighted.

* * * * *

UNITED STATES PATENT AND TRADEMARK OFFICE
CERTIFICATE OF CORRECTION

PATENT NO. : 7,219,291 B2
APPLICATION NO. : 10/416484
DATED : May 15, 2007
INVENTOR(S) : Patrick Adde et al.

Page 1 of 1

It is certified that error appears in the above-identified patent and that said Letters Patent is hereby corrected as shown below:

In the claims

In Column 15, Claim 9:

in lines 17 and 20, delete "1" and insert --l--;

in line 21, delete "m and 1" and insert --m and l--.

In Column 16, Claim 24:

in line 51, delete "f" and insert --of--.

Signed and Sealed this
Fifteenth Day of December, 2015

Michelle K. Lee
*Director of the United States Patent and Trademark Office*